(12) United States Patent
Nakamura et al.

(10) Patent No.: US 9,230,964 B2
(45) Date of Patent: Jan. 5, 2016

(54) STACKED THREE DIMENSIONAL SEMICONDUCTOR DEVICE WITH IN-CIRCUIT ANTENNA

(71) Applicant: FUJITSU LIMITED, Kawasaki-shi, Kanagawa (JP)

(72) Inventors: Naoaki Nakamura, Kawasaki (JP); Makoto Suwada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/540,189

(22) Filed: Nov. 13, 2014

(65) Prior Publication Data

US 2015/0162276 A1 Jun. 11, 2015

(30) Foreign Application Priority Data

Dec. 9, 2013 (JP) .................................. 2013-254136

(51) Int. Cl.
| | |
|---|---|
| *H01L 23/50* | (2006.01) |
| *H01L 27/105* | (2006.01) |
| *H01L 23/48* | (2006.01) |
| *H01L 23/66* | (2006.01) |
| *H01L 25/065* | (2006.01) |
| *H01L 23/00* | (2006.01) |

(52) U.S. Cl.
CPC .......... *H01L 27/1052* (2013.01); *H01L 23/481* (2013.01); *H01L 23/66* (2013.01); *H01L 25/0657* (2013.01); *H01L 24/05* (2013.01); *H01L 24/06* (2013.01); *H01L 24/13* (2013.01); *H01L 24/16* (2013.01); *H01L 24/17* (2013.01); *H01L 2223/6677* (2013.01); *H01L 2224/0401* (2013.01); *H01L 2224/0557* (2013.01); *H01L 2224/05568* (2013.01); *H01L 2224/06181* (2013.01); *H01L 2224/131* (2013.01); *H01L 2224/16145* (2013.01); *H01L 2224/16146* (2013.01); *H01L 2224/16225* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/1431* (2013.01); *H01L 2924/1432* (2013.01); *H01L 2924/1434* (2013.01); *H01L 2924/1436* (2013.01)

(58) Field of Classification Search
CPC ... H01L 23/50; H01L 27/1052; H01L 23/481; H01L 23/66; H01L 25/0657; H01L 2224/06181; H01L 2225/06541; H01L 24/13; H01L 24/16; H01L 2924/1431; H01L 2924/1432
USPC .......... 257/428, 774, 777, 686, 531, E29.325, 257/E21.599; 438/109, 629, 637, 57
See application file for complete search history.

(56) References Cited

U.S. PATENT DOCUMENTS

| | | | |
|---|---|---|---|
| 2006/0115942 | A1 | 6/2006 | Okamoto et al. |
| 2014/0035097 | A1* | 2/2014 | Lin et al. ........................ 257/531 |

FOREIGN PATENT DOCUMENTS

| | | |
|---|---|---|
| JP | 10-135714 A | 5/1998 |
| JP | 2001-297918 A | 10/2001 |
| JP | 2005-341488 A | 12/2005 |
| JP | 2006-179871 A | 7/2006 |

\* cited by examiner

*Primary Examiner* — Thinh T Nguyen
(74) *Attorney, Agent, or Firm* — Squire Patton Boggs (US) LLP

(57) ABSTRACT

A semiconductor device includes: a first semiconductor chip having a first antenna that is formed in a first hole provided in the first semiconductor chip, has an inclined surface inclined with respect to a central line of the first hole, and transmits and receives a radio wave; and a second semiconductor chip stacked over the first semiconductor chip, the second semiconductor chip having a second antenna that is formed in a second hole provided in the second semiconductor chip, has an inclined surface inclined with respect to a central line of the second hole, and transmits and receives a radio wave, wherein the first antenna and the second antenna are disposed so that the inclined surface of the first antenna and the inclined surface of the second antenna face each other.

3 Claims, 16 Drawing Sheets

STACKED THREE DIMENSIONAL SEMICONDUCTOR DEVICE WITH IN-CIRCUIT ANTENNA

CROSS-REFERENCE TO RELATED APPLICATION

This application is based upon and claims the benefit of priority of the prior Japanese Patent Application No. 2013-254136, filed on Dec. 9, 2013, the entire contents of which are incorporated herein by reference.

FIELD

The embodiments discussed herein are related to a semiconductor device.

BACKGROUND

In recent years, as the size of information processing apparatuses has been reduced and speeding-up of processing of the information processing apparatuses has progressed, there has been an increasing demand for smaller semiconductor devices. One example of a memory smaller in size that meets the demand for smaller semiconductor devices is a multilayer memory. The multilayer memory is also called a three-dimensional memory (3D memory). The multilayer memory has a three-dimensional structure, and therefore the effective mounting density may be improved while suppressing an increase in mounting area. Furthermore, since wires connecting stacked semiconductor chips are shortened, the multilayer memory also contributes to an improvement in operation speed and a reduction in electric power consumption.

Communication in a vertical direction (stacking direction) in the multilayer memory may be wired communication using vias connecting the stacked chips or may be wireless communication using planar coils as antennas. Communication in a horizontal direction (plane direction) in the multilayer memory may be wired communication using a wire in a chip or may be wireless communication using vias as antennas. In addition to the communication in the vertical direction and the communication in the horizontal direction in the multilayer memory, there is a demand for communication in an oblique direction in the multilayer memory.

The following are reference documents:
[Document 1] Japanese Laid-open Patent Publication No. 10-135714,
[Document 2] Japanese Laid-open Patent Publication No. 2005-341488,
[Document 3] Japanese Laid-open Patent Publication No. 2001-297918, and
[Document 4] Japanese Laid-open Patent Publication No. 2006-179871.

SUMMARY

According to an aspect of the invention, a semiconductor device includes: a first semiconductor chip having a first antenna that is formed in a first hole provided in the first semiconductor chip, has an inclined surface inclined with respect to a central line of the first hole, and transmits and receives a radio wave; and a second semiconductor chip stacked over the first semiconductor chip, the second semiconductor chip having a second antenna that is formed in a second hole provided in the second semiconductor chip, has an inclined surface inclined with respect to a central line of the second hole, and transmits and receives a radio wave, wherein the first antenna and the second antenna are disposed so that the inclined surface of the first antenna and the inclined surface of the second antenna face each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 15:
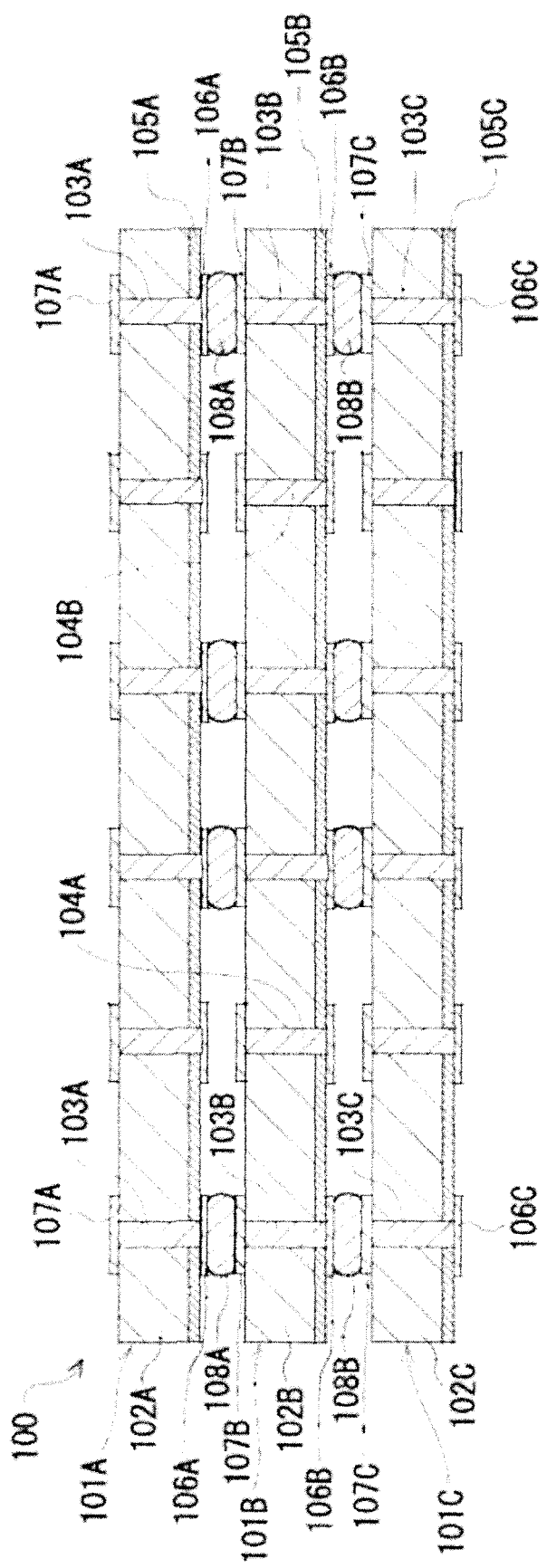
FIG. 15 is a partial cross-sectional view of a multilayer memory according to a reference example.

Reference examples are described below. FIG. 15 is a partial cross-sectional view of a multilayer memory 100 according to a reference example. The multilayer memory 100 illustrated in FIG. 15 has memory chips 101A to 101C that are stacked on each other. The memory chip 101A has a silicon substrate 102A and vias 103A provided in the silicon substrate 102A. The memory chip 101B has a silicon substrate 102B, vias 103B provided in the silicon substrate 102B, and antenna parts 104A and 104B provided in the silicon substrate 102B. The antenna part 104A provided in the silicon substrate 102B and the antenna part 104B provided in the silicon substrate 102B are capable of wirelessly communicating with each other. The memory chip 101C has a silicon substrate 102C and vias 103C provided in the silicon substrate 102C.

The memory chip 101A has a large scale integration (LSI) element 105A and pads 106A and 107A. The LSI element 105A and the pads 106A are formed on a front surface of the silicon substrate 102A. The pads 107A are formed on a rear surface of the silicon substrate 102A. The memory chip 101B has an LSI element 105B and pads 106B and 107B. The LSI element 105B and the pads 106B are formed on a front surface of the silicon substrate 102B. The pads 107B are formed on a rear surface of the silicon substrate 102B. The memory chip 101C has an LSI element 105C and pads 106C and 107C. The LSI element 105C and the pads 106C are formed on a front surface of the silicon substrate 102C. The pads 107C are formed on a rear surface of the silicon substrate 102C.

Bumps 108A are provided between the memory chip 101A and the memory chip 101B. The bumps 108A are bonded to the pads 106A provided on the silicon substrate 102A and are bonded to the pads 107B provided on the silicon substrate 102B. The memory chip 101A and the memory chip 101B are electrically connected to each other via the bumps 108A. Bumps 108B are provided between the memory chip 101B and the memory chip 101C. The bumps 108B are bonded to the pads 106B provided on the silicon substrate 102B and are bonded to the pads 107C provided on the silicon substrate 101C. The memory chip 101B and the memory chip 101C are electrically connected via the bumps 108B.

Figure 16:
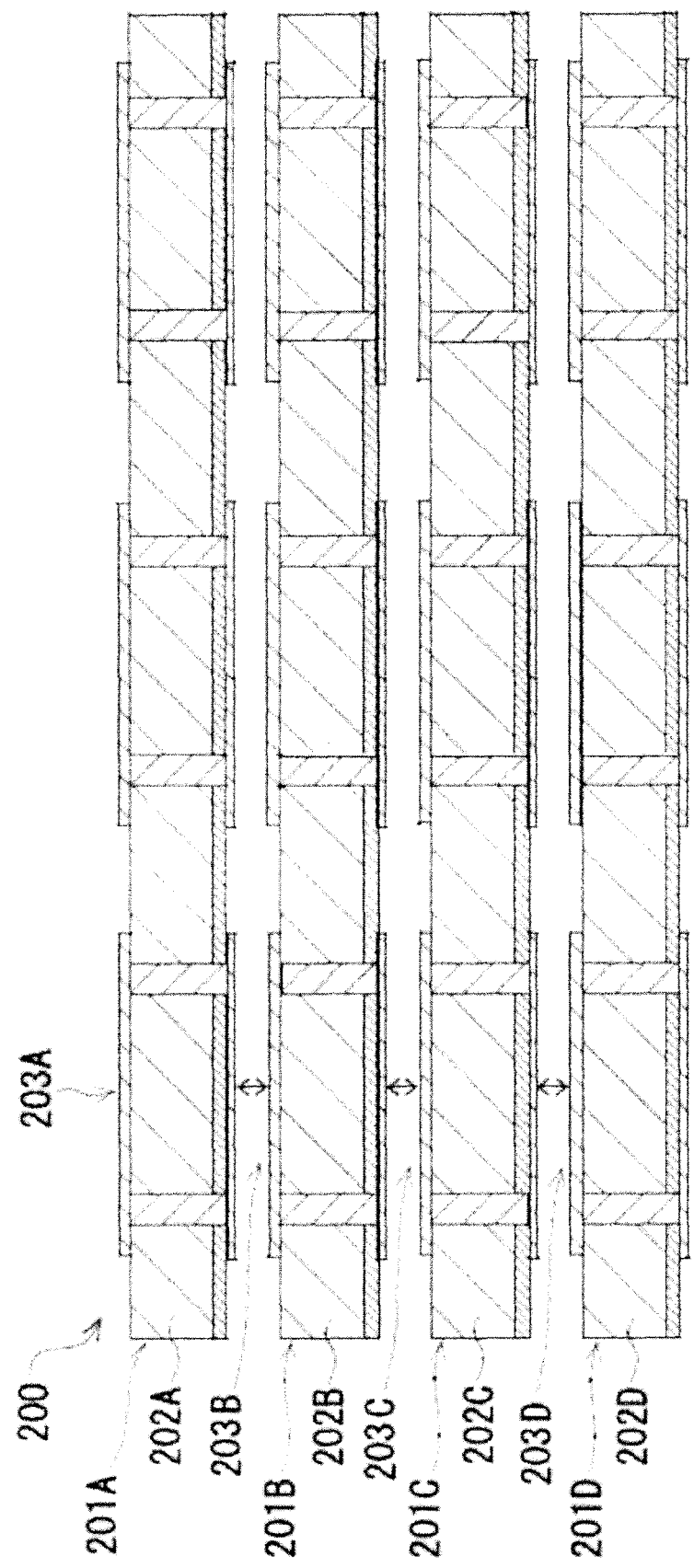
FIG. 16 is a partial cross-sectional view of a multilayer memory according to a reference example.

FIG. 16 is a partial cross-sectional view of a multilayer memory 200 according to a reference example. The multilayer memory 200 illustrated in FIG. 16 has memory chips 201A to 201D that are stacked on each other. The memory chip 201A has a silicon substrate 202A and planar antennas 203A provided on the silicon substrate 202A. The memory chip 201B has a silicon substrate 202B and planar antennas 203B provided on the silicon substrate 202B. The memory chip 201A and the memory chip 201B wirelessly communicate with each other via the planar antennas 203A and 203B. The memory chip 201C has a silicon substrate 202C and planar antennas 203C provided on the silicon substrate 202C. The memory chip 201B and the memory chip 201C wirelessly communicate with each other via the planar antennas 203B and 203C. The memory chip 201D has a silicon substrate 202D and planar antennas 203D provided on the silicon substrate 202D. The memory chip 201C and the memory chip 201D wirelessly communicate with each other via the planar antennas 203C and 203D.

According to the multilayer memory 100 illustrated in FIG. 15, wireless communication in the memory chip 101B is possible. That is, wireless communication in a horizontal direction is possible in the multilayer memory 100. However, according to the multilayer memory 100 illustrated in FIG. 15, wireless communication between the memory chip 101A and the memory chip 101B is not able to be performed. According to the multilayer memory 200 illustrated in FIG. 16, wireless communication between the memory chip 201A and the memory chip 201B is possible. That is, wireless communication in a vertical direction is possible in the multilayer memory 200. However, according to the multilayer memory 200 illustrated in FIG. 16, wireless communication in an oblique direction is not able to be performed.

Embodiments are described below with reference to the drawings. The configurations described in the embodiments are merely illustrative examples, and the configuration of the present device is not limited to those described in the embodiments. In working the configuration of the present device, a specific configuration according to the embodiments may be employed as appropriate.

Figure 1:
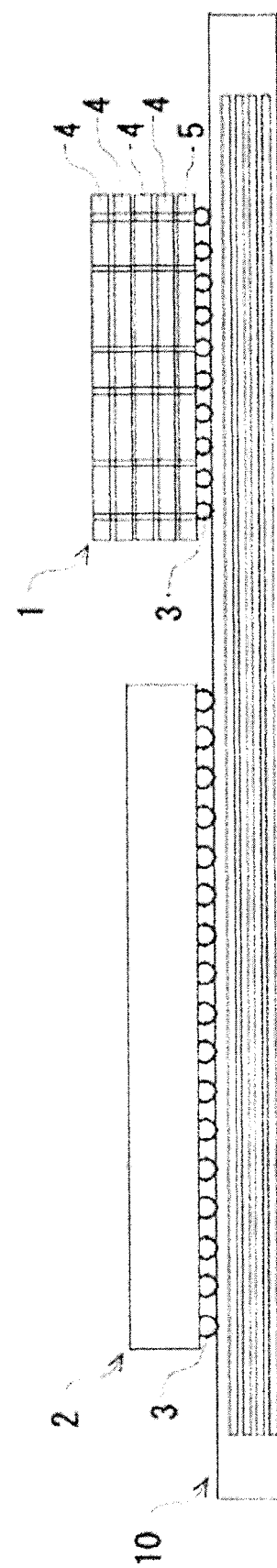
FIG. 1 illustrates an example of a multilayer memory according to an embodiment.

FIG. 1 illustrates an example of a multilayer memory 1 according to an embodiment. The multilayer memory 1 is one example of a semiconductor device. As illustrated in FIG. 1, the multilayer memory 1 and a central processing unit (CPU) 2 are mounted on a main board 10. The multilayer memory 1 and the CPU2 are bonded to the main board 10 via solder balls 3. The multilayer memory 1 and the CPU2 are electrically connected to the main board 10 via the solder balls 3.

The multilayer memory 1 may be, for example, a three-dimensional multilayer memory obtained by stacking a plurality of memory chips 4. The memory chips 4 are, for example, dynamic random access memory (DRAM) chips. The multilayer memory 1 has a logic chip 5 in a bottommost layer and has the plurality of memory chips 4 that are stacked on the logic chip 5. The memory chips 4 and the logic chip 5 are one example of semiconductor chips. The logic chip 5 is provided on the main board 10 so that a front surface of the logic chip 5 faces the main board 10 side. The plurality of memory chips 4 is stacked on the logic chip 5 so that front surfaces of the memory chips 4 face the main board 10 side.

Embodiment 1

Figure 2:
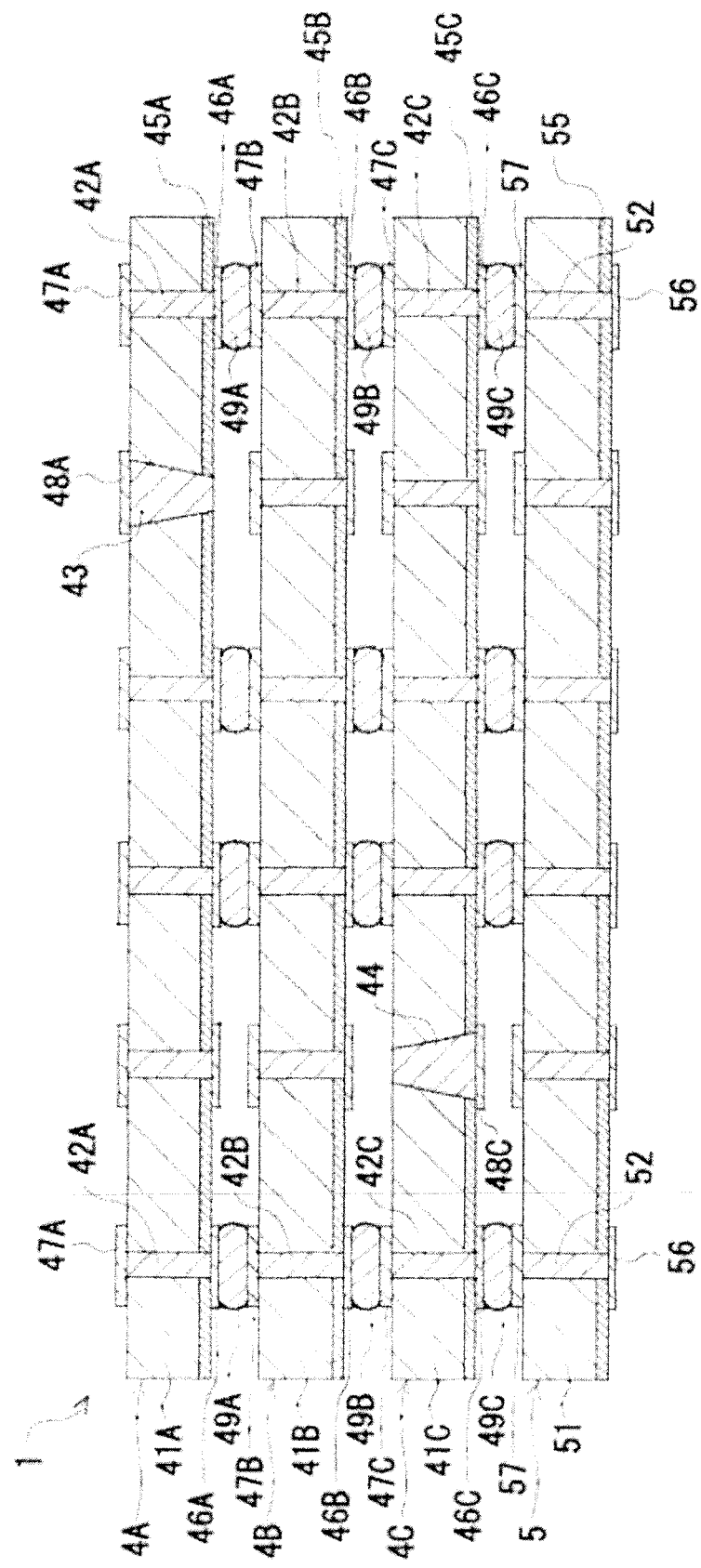
FIG. 2 is a partial cross-sectional view of a multilayer memory according to Embodiment 1.

Embodiment 1 is described below. FIG. 2 is a partial cross-sectional view of a multilayer memory 1 according to Embodiment 1. The multilayer memory 1 illustrated in FIG. 2 has memory chips 4A to 4C and a logic chip 5 that are stacked on each other. Although FIG. 2 illustrates three layers of memory chips 4A to 4C, the number of stacked memory chips 4 is not limited to this. The memory chip 4A has a semiconductor substrate 41A, vias (through-electrodes) 42A provided in the semiconductor substrate 41A, and an antenna part 43 provided in the semiconductor substrate 41A. The memory chip 4A is one example of a first semiconductor chip. The antenna part 43 transmits and receives a radio wave. The antenna part 43 is one example of a first antenna part. The memory chip 4B has a semiconductor substrate 41B and vias 42B provided in the semiconductor substrate 41B.

The memory chip 4C has a semiconductor substrate 41C, vias 42C provided in the semiconductor substrate 41C, and an antenna part 44 provided in the semiconductor substrate 41C. The memory chip 4C is one example of a second semiconductor chip. The antenna part 44 transmits and receives a radio wave. The antenna part 44 is one example of a second antenna part. The logic chip 5 has a semiconductor substrate 51 and vias 52 provided in the semiconductor substrate 51. The semiconductor substrates 41A to 41C and 51 are composed of, for example, silicon (Si) substrates. The vias 42A to 42C and 52 are composed of, for example, a metal such as copper (Cu) or tungsten (W). The antenna parts 43 and 44 are composed of, for example, a metal such as copper (Cu) or tungsten (W).

The semiconductor substrate 41A has through-holes (via holes) that penetrate the semiconductor substrate 41A. The vias 42A and the antenna part 43 are formed in the through-holes provided in the semiconductor substrate 41A. Accordingly, the vias 42A and the antenna part 43 penetrate the semiconductor substrate 41A. The number of through-holes provided in the semiconductor substrate 41A is more than one, and the number of vias 42A formed in the semiconductor substrate 41A is more than one.

The memory chip 4A has a semiconductor element part 45A and pads 46A, 47A, and 48A. The semiconductor element part 45A is, for example, an LSI element. The semiconductor element part 45A and the pads 46A are formed on a front surface (main surface) of the semiconductor substrate 41A. The pads 46A are electrodes that are connected to the vias 42A exposed on the front surface of the semiconductor substrate 41A. The pads 47A and 48A are formed on a rear surface (surface opposite to the main surface) of the semiconductor substrate 41A. The pads 47A are electrodes that are connected to the vias 42A exposed on the rear surface of the semiconductor substrate 41A. Both of the number of pads 46A and the number of pads 47A formed on the semiconductor substrate 41A are more than one. The pad 48A is an electrode that is connected to the antenna part 43 exposed on the rear surface of the semiconductor substrate 41A.

The semiconductor substrate 41B has through-holes that penetrate the semiconductor substrate 41B. The vias 42B are formed in the through-holes provided in the semiconductor substrate 41B. Accordingly, the vias 42B penetrate the semiconductor substrate 41B. The number of through-holes provided in the semiconductor substrate 41B is more than one, and the number of vias 42B formed in the semiconductor substrate 41B is more than one.

The memory chip 4B has a semiconductor element part 45B and pads 46B and 47B. The semiconductor element part 45B is, for example, an LSI element. The semiconductor element part 45B and the pads 46B are formed on a front surface of the semiconductor substrate 41B. The pads 46B are electrodes that are connected to the vias 42B exposed on the front surface of the semiconductor substrate 41B. The pads 47B are formed on a rear surface of the semiconductor substrate 41B. The pads 47B are electrodes that are connected to the vias 42B exposed on the rear surface of the semiconductor substrate 41B. Both of the number of pads 46B and the number of pads 47B formed on the semiconductor substrate 41B are more than one.

Bumps 49A are provided between the memory chip 4A and the memory chip 4B. The bumps 49A are, for example, solder. The bumps 49A are bonded to the pads 46A provided on the semiconductor substrate 41A and are bonded to the pads 47B provided on the semiconductor substrate 41B. The memory chip 4A and the memory chip 4B are electrically connected to each other via the bumps 49A.

The semiconductor substrate 41C has through-holes that penetrate the semiconductor substrate 41C. The vias 42C and the antenna part 44 are formed in the through-holes provided in the semiconductor substrate 41C. Accordingly, the vias 42C and the antenna part 44 penetrate the semiconductor substrate 41C. The number of through-holes provided in the semiconductor substrate 41C is more than one, and the number of vias 42C formed in the semiconductor substrate 41C is more than one.

The memory chip 4C has a semiconductor element part 45C and pads 46C, 47C, and 48C. The semiconductor element part 45C is, for example, an LSI element. The semiconductor element part 45C and the pads 46C and 48C are formed on a front surface of the semiconductor substrate 41C. The pads 46C are electrodes that are connected to the vias 42C exposed on the front surface of the semiconductor substrate 41C. The pad 48C is an electrode that is connected to the antenna part 44 exposed on the front surface of the semiconductor substrate 41C.

The pads 47C are formed on a rear surface of the semiconductor substrate 41C. The pads 47C are electrodes that are connected to the vias 42C exposed on the rear surface of the semiconductor substrate 41C. Both of the number of pads 46C and the number of pads 47C formed on the semiconductor substrate 41C are more than one.

Bumps 49B are provided between the memory chip 4B and the memory chip 4C. The bumps 49B are, for example, solder. The bumps 49B are bonded to the pads 46B provided on the semiconductor substrate 41B and are bonded to the pads 47C provided on the semiconductor substrate 41C. The memory chip 4B and the memory chip 4C are electrically connected to each other via the bumps 49B.

The semiconductor substrate 51 has through-holes that penetrate the semiconductor substrate 51. The vias 52 are formed in the through-holes provided in the semiconductor substrate 51. Accordingly, the vias 52 penetrate the semiconductor substrate 51. The number of through-holes provided in the semiconductor substrate 51 is more than one, and the number of vias 52 formed in the semiconductor substrate 51 is more than one.

The logic chip 5 has a semiconductor element part 55 and pads 56 and 57. The semiconductor element part 55 is, for example, an LSI element. The semiconductor element part 55 and the pads 56 are formed on a front surface (main surface) of the semiconductor substrate 51. The pads 56 are electrodes that are connected to the vias 52 exposed on the front surface of the semiconductor substrate 51. The pads 57 are formed on a rear surface (surface opposite to the main surface) of the semiconductor substrate 51. The pads 57 are electrodes that are connected to the vias 52 exposed on the rear surface of the semiconductor substrate 51. Both of the number of pads 56 and the number of pads 57 formed on the semiconductor substrate 51 are more than one.

Bumps 49C are provided between the memory chip 4C and the logic chip 5. The bumps 49C are, for example, solder. The bumps 49C are bonded to the pads 46C provided on the semiconductor substrate 41C and are bonded to the pads 57 provided on the semiconductor substrate 51. The memory chip 4C and the logic chip 5 are electrically connected to each other via the bumps 49C.

The thickness of the semiconductor substrates 41A to 41C and 51 is approximately 50 μm. The diameter of the vias 42A to 42C and 52 is, for example, approximately several μm to several tens of μm. The pitch of the vias 42A to 42C and 52 is, for example, approximately several tens of μm.

Figure 3A:
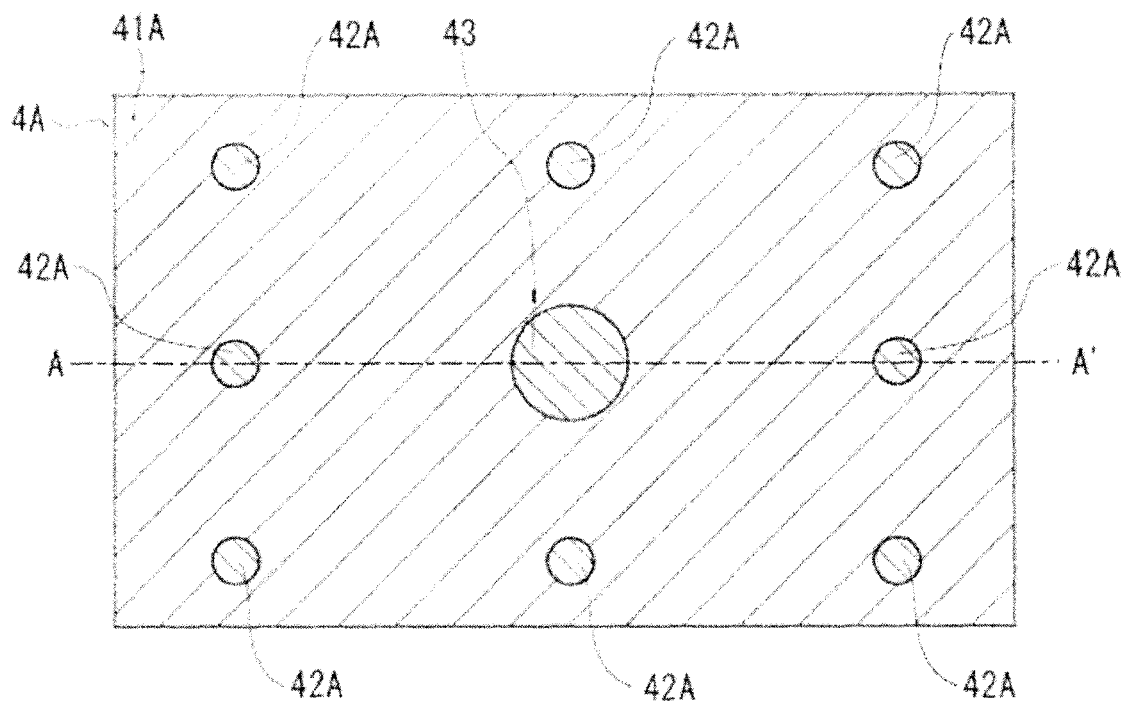
FIG. 3A is a plan view of vias and an antenna part.
Figure 3B:
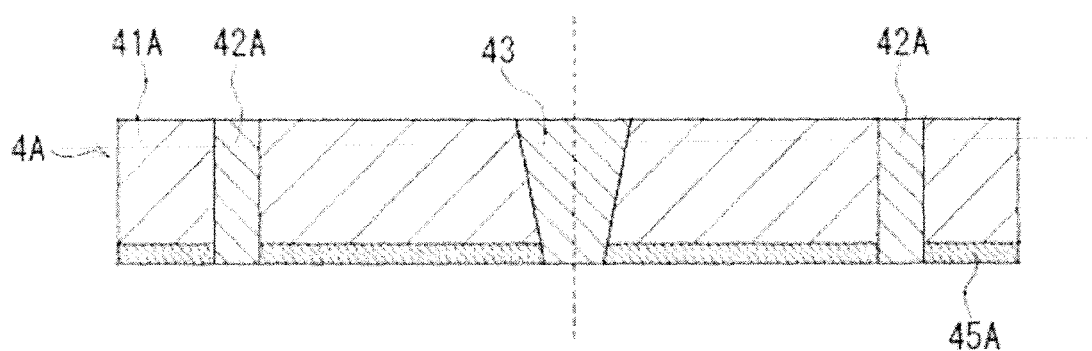
FIG. 3B is a cross-sectional view of the vias and the antenna part.

FIG. 3A is a plan view of the vias 42A and the antenna part 43. FIG. 3B is a cross-sectional view of the vias 42A and the antenna part 43 and illustrates a cross section taken along the line A-A' with alternating long and short dashes in FIG. 3A. Each of the vias 42A has a cylindrical shape. The diameter of an end of each of the vias 42A that is exposed on the front surface of the semiconductor substrate 41A is substantially identical to that of an end of the via 42A that is exposed on the rear surface of the semiconductor substrate 41A. The antenna part 43 has a tapered shape. The diameter of the antenna part 43 becomes larger in a direction from one end thereof that is exposed on the front surface of the semiconductor substrate 41A toward the other end thereof that is exposed on the rear surface of the semiconductor substrate 41A. Accordingly, the antenna part 43 has an inclined surface that is inclined with respect to a central line of a through-hole provided in the semiconductor substrate 41A. The inclined surface of the antenna part 43 is a surface that is in contact with the semiconductor substrate 41A and faces an obliquely downward direction. In FIG. 3B, the central line of the through-hole provided in the semiconductor substrate 41A is indicated by the dashed line.

Figure 4A:
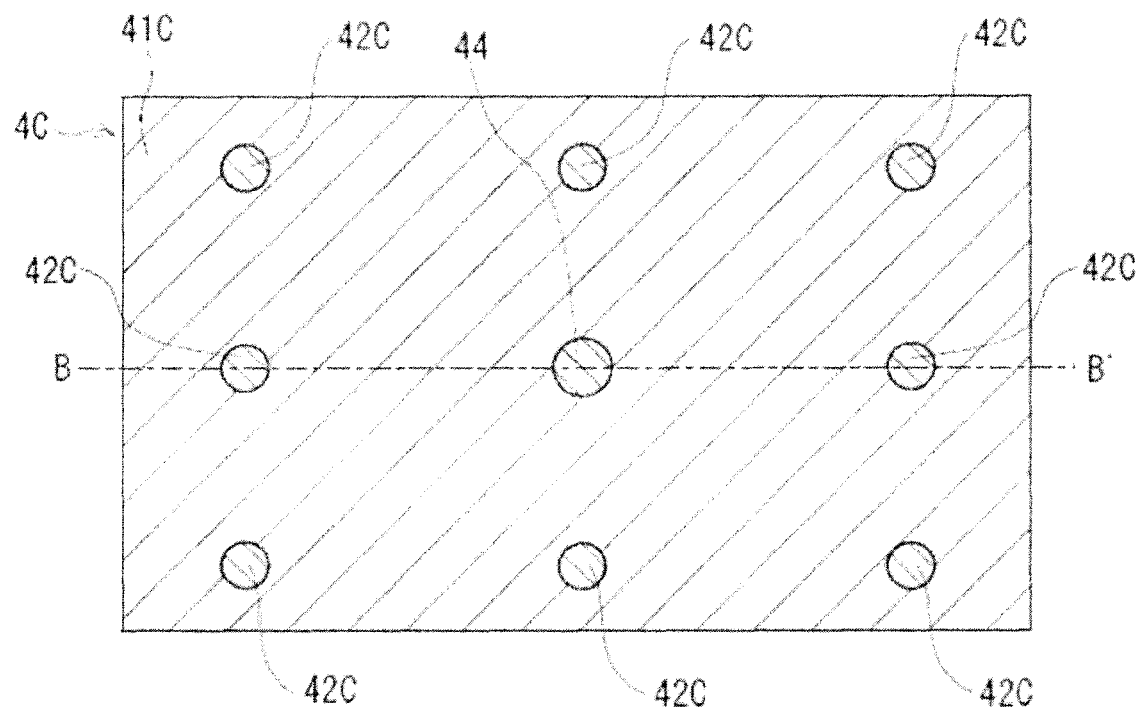
FIG. 4A is a plan view of vias and an antenna part.
Figure 4B:
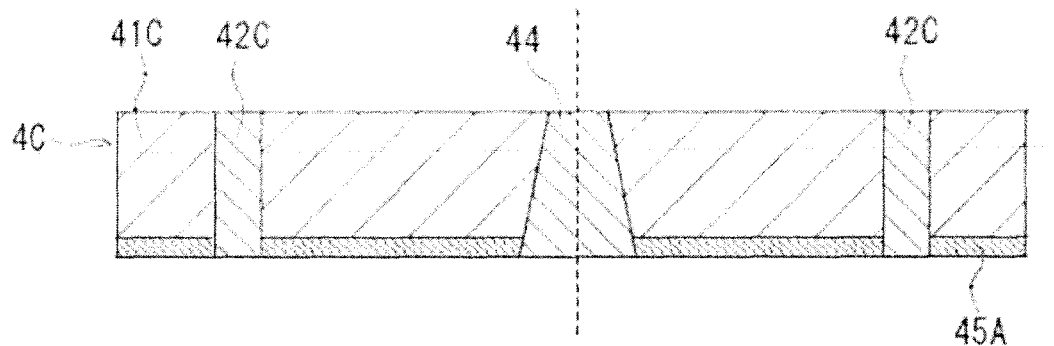
FIG. 4B is a cross-sectional view of the vias and the antenna part.

FIG. 4A is a plan view of the vias 42C and the antenna part 44. FIG. 4B is a cross-sectional view of the vias 42C and the antenna part 44 and illustrates a cross section taken along the line B-B' with alternating long and short dashes in FIG. 4A. Each of the vias 42C has a cylindrical shape. The diameter of an end of each of the vias 42C that is exposed on the front surface of the semiconductor substrate 41C is substantially identical to that of an end of the via 42C that is exposed on the rear surface of the semiconductor substrate 41C. The antenna part 44 has a tapered shape. The diameter of the antenna part 44 becomes smaller in a direction from one end thereof that is exposed on the front surface of the semiconductor substrate 41C toward the other end thereof that is exposed on the rear surface of the semiconductor substrate 41C. Accordingly, the antenna part 44 has an inclined surface that is inclined with respect to a central line of a through-hole provided in the semiconductor substrate 41C. The inclined surface of the antenna part 44 is a surface that is in contact with the semiconductor substrate 41C and faces an obliquely upward direction. In FIG. 4B, the central line of the through-hole provided in the semiconductor substrate 41C is indicated by the dashed line.

As illustrated in FIG. 2, in the multilayer memory 1, the antenna part 43 and the antenna part 44 are disposed so that the inclined surface of the antenna part 43 and the inclined surface of the antenna part 44 face each other. Since the inclined surface of the antenna part 43 and the inclined surface of the antenna part 44 face each other, directivity gain becomes larger, and thus transmission in an oblique direction becomes possible. The directivity gain is a ratio of radiant intensity in a specific direction to radiant intensity of radio waves emitted from an antenna uniformly in all directions. By disposing the pair of antenna parts 43 and 44 so that the inclined surface of the antenna part 43 and the inclined surface of the antenna part 44 face each other, wireless communication in the oblique direction between the antenna part 43 and the antenna part 44 becomes possible. This allows wireless communication in the oblique direction to be performed between the memory chip 4A and the memory chip 4C that are in different layers of the multilayer memory 1.

A logical formula of directivity gain is as follows:

$$\text{directivity gain } D = Na \cdot (4\pi/\lambda^2) \cdot S$$

where Na represents an aperture ratio, S represents an antenna area, and $\lambda$ represents a wavelength.

According to the logical formula, the following (1) and (2) are important for increasing directivity gain: (1) Reduce the wavelength (shorten antennas) and (2) Dispose a pair of antennas so that the pair of antennas face each other, and thereby increase the area over which the opposing portions of the pair of antennas overlap. It is to be noted that the aperture ratio is 1 because of uniform distribution.

By disposing the pair of antenna parts 43 and 44 so that the inclined surface of the antenna part 43 and the inclined surface of the antenna part 44 face each other, the areas of opposing portions of the pair of antenna parts 43 and 44 become larger. The pair of antenna parts 43 and 44 may be disposed such that an angle of the inclined surface of the antenna part 43 with respect to the central line of the through-hole provided in the semiconductor substrate 41A is identical or approximate to that of the inclined surface of the antenna part 44 with respect to the central line of the through-hole provided in the semiconductor substrate 41C. In a case where the angle of the inclined surface of the antenna part 43 is identical or approximate to that of the inclined surface of the antenna part 44, the areas of the opposing portions of the pair of antenna parts 43 and 44 become even larger.

The following describes an example of formation of the vias 42A and the antenna part 43 in the semiconductor substrate 41A. First, the rear surface of the semiconductor substrate 41A is coated with resist liquid. Next, a first resist pattern is formed on the rear surface of the semiconductor substrate 41A by photolithography. The first resist pattern has openings at portions that correspond to positions where the vias 42A are formed. Next, anisotropic etching is performed by using the first resist pattern as a mask. Thus, through-holes each having a cylindrical shape are formed in the semiconductor substrate 41A.

Next, the remaining first resist pattern is removed, and then the rear surface of the semiconductor substrate 41A is coated with resist liquid. Next, a second resist pattern is formed on the rear surface of the semiconductor substrate 41A by photolithography. The second resist pattern has an opening at a portion that corresponds to a position where the antenna part 43 is formed. Next, anisotropic etching is performed by using the second resist pattern as a mask. Thus, a through-hole having a tapered shape is formed in the semiconductor substrate 41A. Next, the remaining second resist pattern is removed. The through-holes each having a cylindrical shape and the through-hole having a tapered shape are formed in the semiconductor substrate 41A by selecting proper process conditions of the anisotropic etching.

Next, the through-holes each having a cylindrical shape and the through-hole having a tapered shape that are formed in the semiconductor substrate 41A are filled with a metal such as copper or tungsten. This forms the vias 41A in the through-holes each having a cylindrical shape that are formed in the semiconductor substrate 41A and forms the antenna part 43 in the through-hole having a tapered shape that is formed in the semiconductor substrate 41A.

The following describes an example of formation of the vias 42C and the antenna part 44 in the semiconductor substrate 41C. First, the front surface of the semiconductor substrate 41C is coated with resist liquid. Next, a third resist pattern is formed on the front surface of the semiconductor substrate 41C by photolithography. The third resist pattern has openings at portions that correspond to positions where the vias 42C are formed. Next, anisotropic etching is performed by using the third resist pattern as a mask. Thus, through-holes each having a cylindrical shape are formed in the semiconductor substrate 41C.

Next, the remaining third resist pattern is removed, and then the front surface of the semiconductor substrate 41C is coated with resist liquid. Next, a fourth resist pattern is formed on the front surface of the semiconductor substrate 41C by photolithography. The fourth resist pattern has an opening at a portion that corresponds to a position where the antenna part 44 is formed. Next, anisotropic etching is performed by using the fourth resist pattern as a mask. Thus, a through-hole having a tapered shape is formed in the semiconductor substrate 41C. Next, the remaining fourth resist pattern is removed. The through-holes each having a cylindrical shape and the through-hole having a tapered shape are formed in the semiconductor substrate 41C by selecting proper process conditions of the anisotropic etching.

Next, the through-holes each having a cylindrical shape and the through-hole having a tapered shape that are formed in the semiconductor substrate 41C are filled with a metal such as copper or tungsten. This forms the vias 41C in the through-holes each having a cylindrical shape that are formed in the semiconductor substrate 41C and forms the antenna part 44 in the through-hole having a tapered shape that is formed in the semiconductor substrate 41C.

FIG. 2 illustrates an example in which one pair of antenna parts 43 and 44 is disposed in the multilayer memory 1. The present embodiment is not limited to the example illustrated in FIG. 2. A plurality of pairs of antenna parts 43 and 44 may be disposed in the multilayer memory 1.

The way in which the antenna parts 43 and 44 are disposed is not limited to that illustrated in FIG. 2. For example, the memory chip 4B may have the antenna part 43 or 44. That is, the antenna part 43 or 44 may be provided in the semiconductor substrate 41B. In a case where the memory chip 4B has the antenna part 43, wireless communication in an oblique direction may be performed between the memory chip 4B and the memory chip 4C that are in different layers of the multilayer memory 1. In a case where the memory chip 4B has the antenna part 44, wireless communication in an oblique direction may be performed between the memory chip 4A and the memory chip 4B that are in different layers of the multilayer memory 1. For example, the logic chip 5 may have the antenna part 44. That is, the antenna part 44 may be provided in the semiconductor substrate 51. In a case where the logic chip 5 has the antenna part 44, wireless communication in an oblique direction may be performed between the memory chip 4A and the logic chip 5 that are in different layers of the multilayer memory 1.

Embodiment 2

Figure 5A:
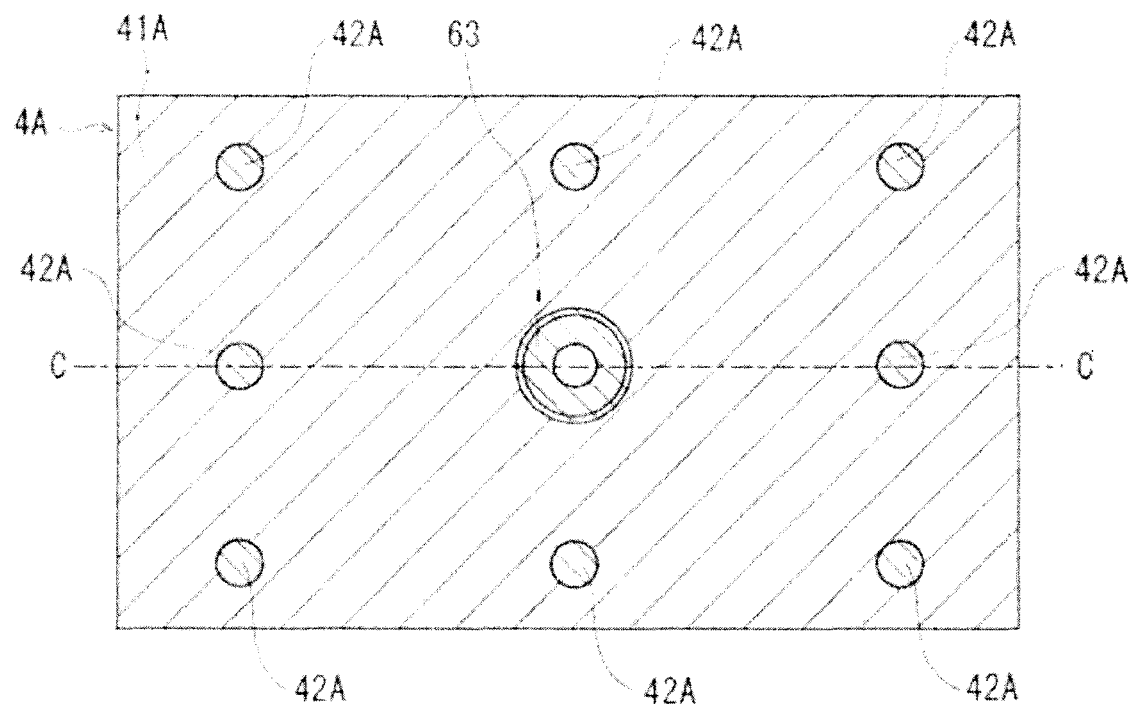
FIG. 5A is a plan view of vias and an antenna part.
Figure 5B:
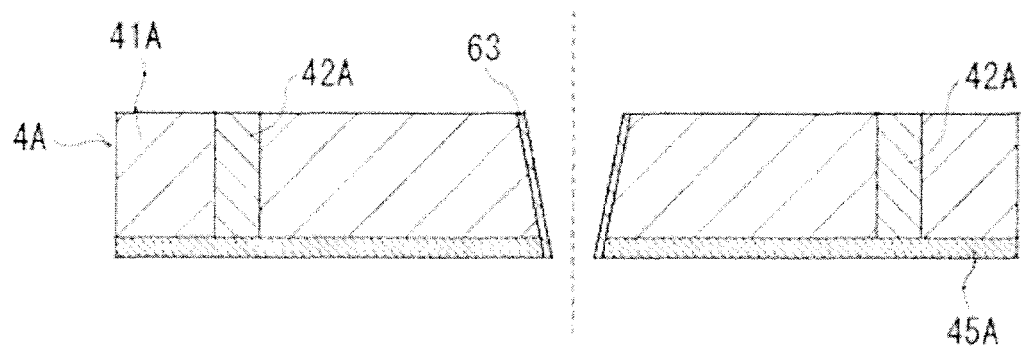
FIG. 5B is a cross-sectional view of the vias and the antenna part.

Embodiment 2 is described below. Identical constituent members to those in Embodiment 1 are given identical reference numerals and are not explained repeatedly. Embodiment 1 and Embodiment 2 may be combined. FIG. 5A is a plan view of vias 42A and an antenna part 63. FIG. 5B is a cross-sectional view of the vias 42A and the antenna part 63 and illustrates a cross section taken along the line C-C' with alternating long and short dashes in FIG. 5A. A semiconductor substrate 41A has through-holes that penetrate the semiconductor substrate 41A. The vias 42A and the antenna part 63 are formed in the through-holes provided in the semiconductor substrate 41A. Accordingly, the vias 42A and the antenna part 63 penetrate the semiconductor substrate 41A. The antenna part 63 transmits and receives a radio wave. The number of through-holes provided in the semiconductor substrate 41A is more than one, and the number of vias 42A formed in the semiconductor substrate 41A is more than one.

The antenna part 63 has a tapered shape. The antenna part 63 is formed along an outer periphery of a through-hole provided in the semiconductor substrate 41A so as to have a tube shape. The diameter of the antenna part 63 becomes larger in a direction from one end thereof that is exposed on a front surface of the semiconductor substrate 41A toward the other end thereof that is exposed on a rear surface of the semiconductor substrate 41A. Accordingly, the antenna part 63 has an inclined surface that is inclined with respect to a central line of the through-hole provided in the semiconductor substrate 41A. The inclined surface of the antenna part 63 is a surface that is in contact with the semiconductor substrate 41A and faces an obliquely downward direction. In FIG. 5B, the central line of the through-hole provided in the semiconductor substrate 41A is indicated by the dashed line.

Figure 6A:
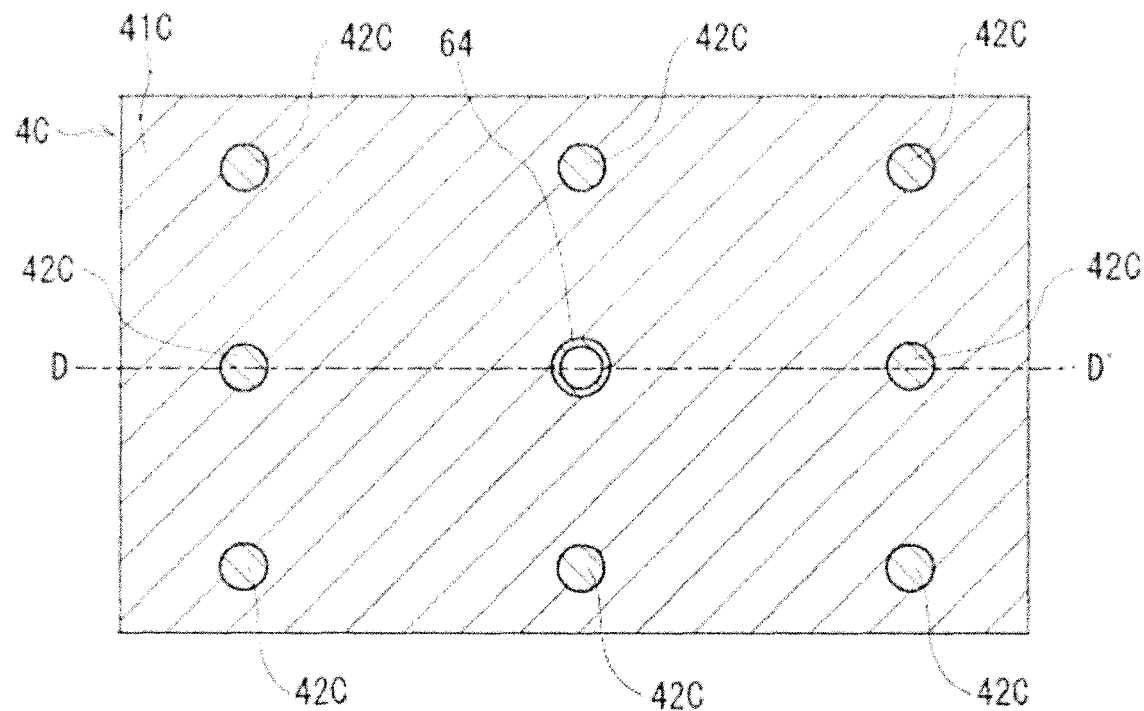
FIG. 6A is a plan view of vias and an antenna part.
Figure 6B:
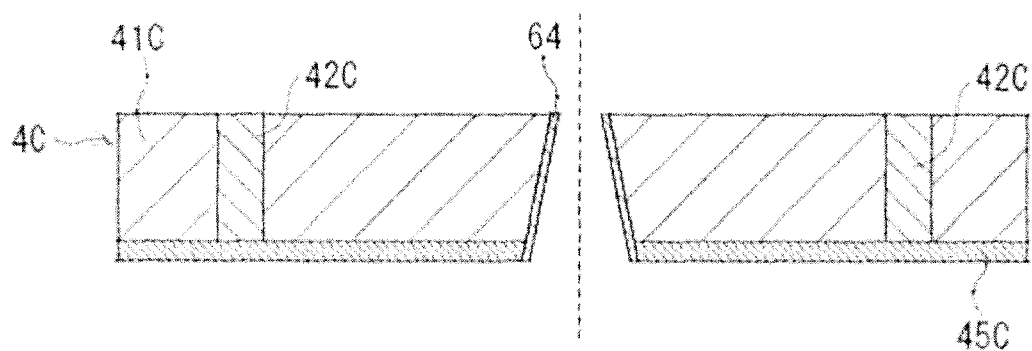
FIG. 6B is a cross-sectional view of the vias and the antenna part.

FIG. 6A is a plan view of vias 42C and an antenna part 64. FIG. 6B is a cross-sectional view of the vias 42C and the antenna part 64 and illustrates a cross section taken along the line D-D' with alternating long and short dashes in FIG. 6A. A semiconductor substrate 41C has through-holes that penetrate the semiconductor substrate 41C. The vias 42C and the antenna part 64 are formed in the through-holes provided in the semiconductor substrate 41C. Accordingly, the vias 42C and the antenna part 64 penetrate the semiconductor substrate 41C. The antenna part 64 transmits and receives a radio wave. The number of through-holes provided in the semiconductor substrate 41C is more than one, and the number of vias 42C formed in the semiconductor substrate 41C is more than one.

The antenna part 64 has a tapered shape. The antenna part 64 is formed along an outer periphery of a through-hole provided in the semiconductor substrate 41C so as to have a tube shape. The diameter of the antenna part 64 becomes smaller in a direction from one end thereof that is exposed on a front surface of the semiconductor substrate 41C toward the other end thereof that is exposed on a rear surface of the semiconductor substrate 41C. Accordingly, the antenna part 64 has an inclined surface that is inclined with respect to a central line of the through-hole provided in the semiconductor substrate 41C. The inclined surface of the antenna part 64 is a surface that is in contact with the semiconductor substrate 41C and faces an obliquely upward direction. In FIG. 6B, the central line of the through-hole provided in the semiconductor substrate 41C is indicated by the dashed line.

The way in which the antenna parts 63 and 64 are disposed is similar to that of the antenna parts 43 and 44 in Embodiment 1. That is, in the multilayer memory 1, the antenna part 63 and the antenna part 64 are disposed so that the inclined surface of the antenna part 63 and the inclined surface of the antenna part 64 face each other. By disposing the pair of antenna parts 63 and 64 so that the inclined surface of the antenna part 63 and the inclined surface of the antenna part 64 face each other, wireless communication in an oblique direction between the antenna part 63 and the antenna part 64 becomes possible. That is, wireless communication in the oblique direction may be performed between the memory chip 4A and the memory chip 4C that are in different layers of the multilayer memory 1.

The pair of antenna parts 63 and 64 may be disposed such that an angle of the inclined surface of the antenna part 63 with respect to the central line of the through-hole provided in the semiconductor substrate 41A is identical or approximate to that of the inclined surface of the antenna part 64 with respect to the central line of the through-hole provided in the semiconductor substrate 41C. A plurality of pairs of antenna parts 63 and 64 may be disposed in the multilayer memory 1.

Embodiment 3

Figure 7A:
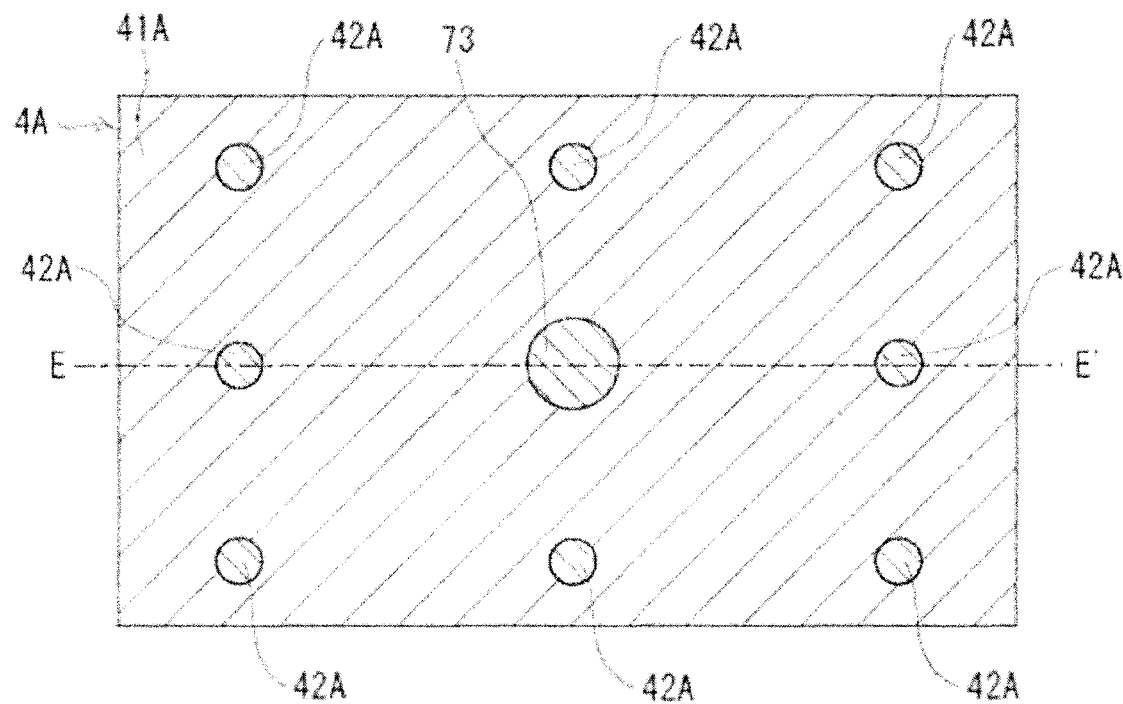
FIG. 7A is a plan view of vias and an antenna part.
Figure 7B:
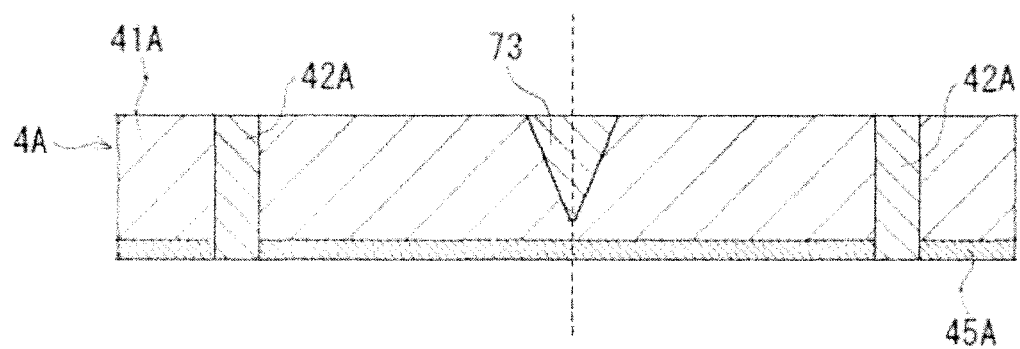
FIG. 7B is a cross-sectional view of the vias and the antenna part.

Embodiment 3 is described below. Identical constituent members to those in Embodiment 1 are given identical reference numerals and are not explained repeatedly. Embodiment 1 through Embodiment 3 may be combined. FIG. 7A is a plan view of vias 42A and an antenna part 73. FIG. 7B is a cross-sectional view of the vias 42A and the antenna part 73 and illustrates a cross section taken along the line E-E' with alternating long and short dashes in FIG. 7A. A semiconductor substrate 41A has through-holes that penetrate the semiconductor substrate 41A. The vias 42A are formed in the through-holes provided in the semiconductor substrate 41A. Accordingly, the vias 42A penetrate the semiconductor substrate 41A. The number of through-holes provided in the semiconductor substrate 41A is more than one, and the number of vias 42A formed in the semiconductor substrate 41A is more than one. The semiconductor substrate 41A has a non-through hole that ends inside the semiconductor substrate 41A. The antenna part 73 is formed in the non-through hole provided in the semiconductor substrate 41A. Accordingly, the antenna part 73 does not penetrate the semiconductor substrate 41A. That is, the non-penetrating antenna part 73 is formed in the semiconductor substrate 41A. The antenna part 73 transmits and receives a radio wave.

The antenna part 73 has a tapered shape. The diameter of the antenna part 73 becomes smaller in a direction from one end thereof that is exposed on a rear surface of the semiconductor substrate 41A toward the inside of the semiconductor substrate 41A. Accordingly, the antenna part 73 has an inclined surface that is inclined with respect to a central line of the non-through hole provided in the semiconductor substrate 41A. The inclined surface of the antenna part 73 is a surface that is in contact with the semiconductor substrate 41A and faces an obliquely downward direction. In FIG. 7B, the central line of the non-through hole provided in the semiconductor substrate 41A is indicated by the dashed line.

Figure 8A:
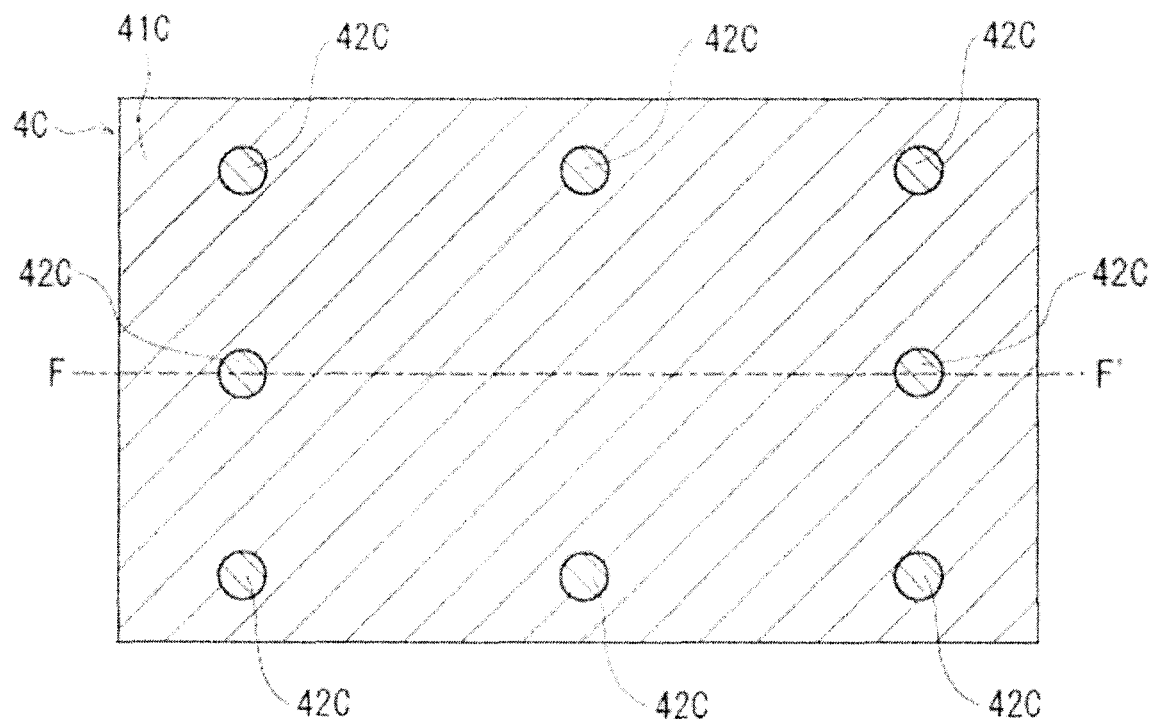
FIG. 8A is a plan view of vias and an antenna part.
Figure 8B:
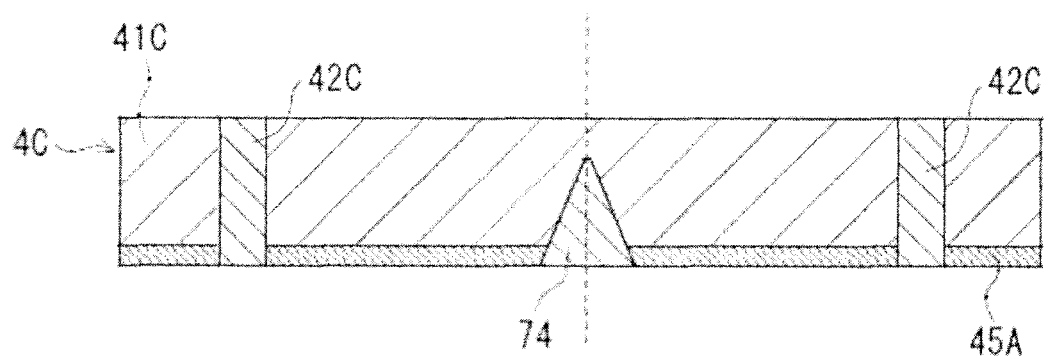
FIG. 8B is a cross-sectional view of the vias and the antenna part.

FIG. 8A is a plan view of vias 42C and an antenna part 74. FIG. 8B is a cross-sectional view of the vias 42C and the antenna part 74 and illustrates a cross section taken along the line F-F' with alternating long and short dashes in FIG. 8A. A semiconductor substrate 41C has through-holes that penetrate the semiconductor substrate 41C. The vias 42C are formed in the through-holes provided in the semiconductor substrate 41C. Accordingly, the vias 42C penetrate the semiconductor substrate 41C. The number of through-holes provided in the semiconductor substrate 41C is more than one, and the number of vias 42C formed in the semiconductor substrate 41C is more than one. The semiconductor substrate 41C has a non-through hole that ends inside the semiconductor substrate 41C. The antenna part 74 is formed in the non-through hole provided in the semiconductor substrate 41C. Accordingly, the antenna part 74 does not penetrate the semiconductor substrate 41C. That is, the non-penetrating antenna part 74 is formed in the semiconductor substrate 41C. The antenna part 74 transmits and receives a radio wave.

The antenna part 74 has a tapered shape. The diameter of the antenna part 74 becomes smaller in a direction from one end thereof that is exposed on a front surface of the semiconductor substrate 41C toward the inside of the semiconductor substrate 41C. Accordingly, the antenna part 74 has an inclined surface that is inclined with respect to a central line of the non-through hole provided in the semiconductor substrate 41C. The inclined surface of the antenna part 74 is a surface that is in contact with the semiconductor substrate 41C and faces an obliquely upward direction. In FIG. 8B, the central line of the non-through hole provided in the semiconductor substrate 41C is indicated by the dashed line.

The way in which the antenna parts 73 and 74 are disposed is similar to that of the antenna parts 43 and 44 in Embodiment 1. That is, in the multilayer memory 1, the antenna part 73 and the antenna part 74 are disposed so that the inclined surface of the antenna part 73 and the inclined surface of the antenna part 74 face each other. By disposing the pair of antenna parts 73 and 74 so that the inclined surface of the antenna part 73 and the inclined surface of the antenna part 74 face each other, wireless communication in an oblique direction between the antenna part 73 and the antenna part 74 becomes possible. That is, wireless communication in the oblique direction may be performed between the memory chip 4A and the memory chip 4C that are in different layers of the multilayer memory 1.

The pair of antenna parts 73 and 74 may be disposed such that an angle of the inclined surface of the antenna part 73 with respect to the central line of the non-through hole provided in the semiconductor substrate 41A is identical or approximate to that of the inclined surface of the antenna part 74 with respect to the central line of the non-through hole provided in the semiconductor substrate 41C. A plurality of pairs of antenna parts 73 and 74 may be disposed in the multilayer memory 1.

Embodiment 4

Figure 9:
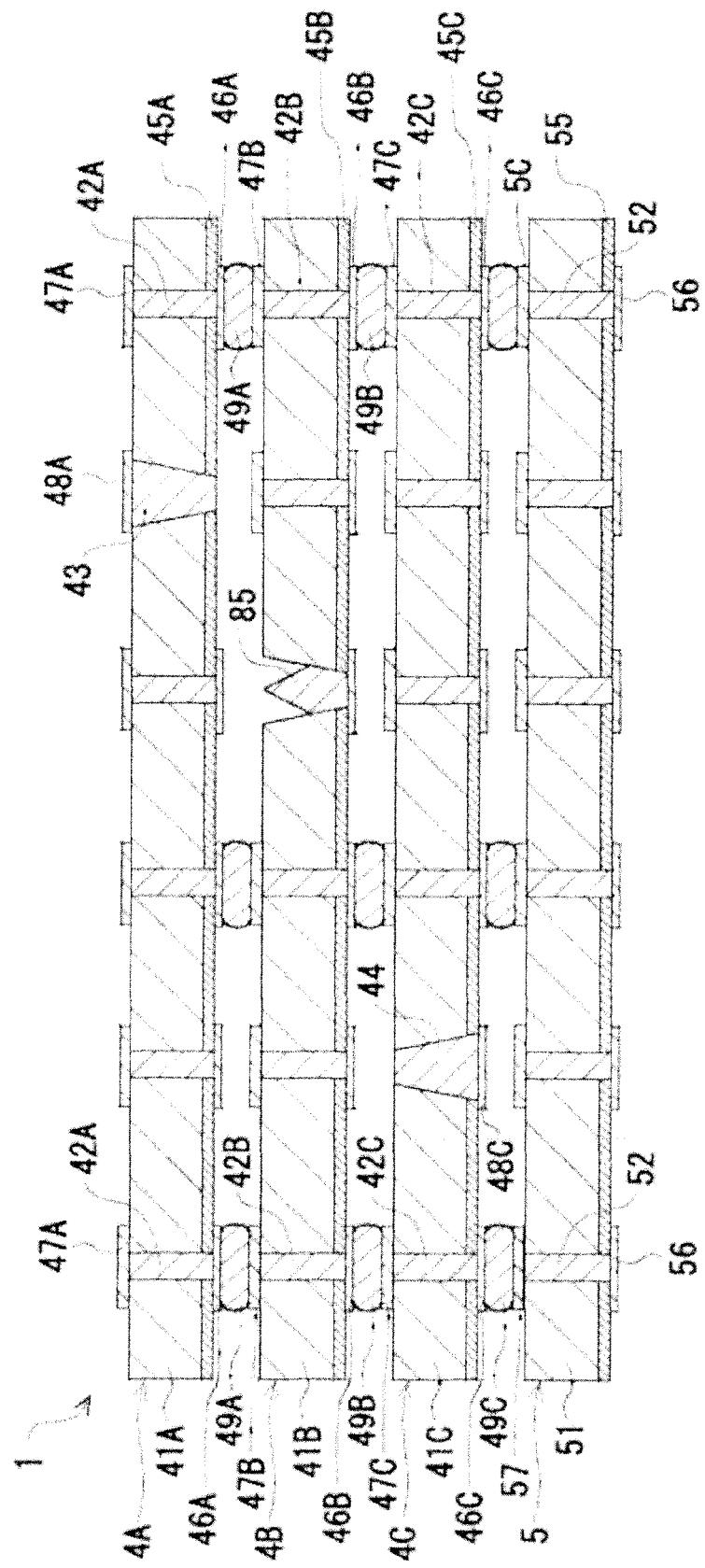
FIG. 9 is a partial cross-sectional view of a multilayer memory according to Embodiment 4.

Embodiment 4 is described below. Identical constituent members to those in Embodiment 1 are given identical reference numerals and are not explained repeatedly. Embodiment 1 through Embodiment 4 may be combined. FIG. 9 is a partial cross-sectional view of a multilayer memory 1 according to Embodiment 4. The multilayer memory 1 illustrated in FIG. 9 has memory chips 4A to 4C and a logic chip 5 that are stacked on each other. Although FIG. 9 illustrates three layers of memory chips 4A to 4C, the number of stacked memory chips 4 is not limited to this.

The memory chip 4A has a semiconductor substrate 41A, vias 42A provided in the semiconductor substrate 41A, and an antenna part 43 provided in the semiconductor substrate 41A. The memory chip 4B has a semiconductor substrate 41B, vias 42B provided in the semiconductor substrate 41B, and an antenna part 85 provided in the semiconductor substrate 41B. The antenna part 85 transmits and receives a radio wave. The memory chip 4B is one example of a third semiconductor chip. The antenna part 85 is one example of a third antenna part. The antenna part 85 is composed of, for example, a metal such as copper or tungsten. The memory chip 4C has a semiconductor substrate 41C, vias 42C provided in the semiconductor substrate 41C, and an antenna part 44 provided in the semiconductor substrate 41C. The logic chip 5 has a semiconductor substrate 51 and vias 52 provided in the semiconductor substrate 51.

Figure 10A:
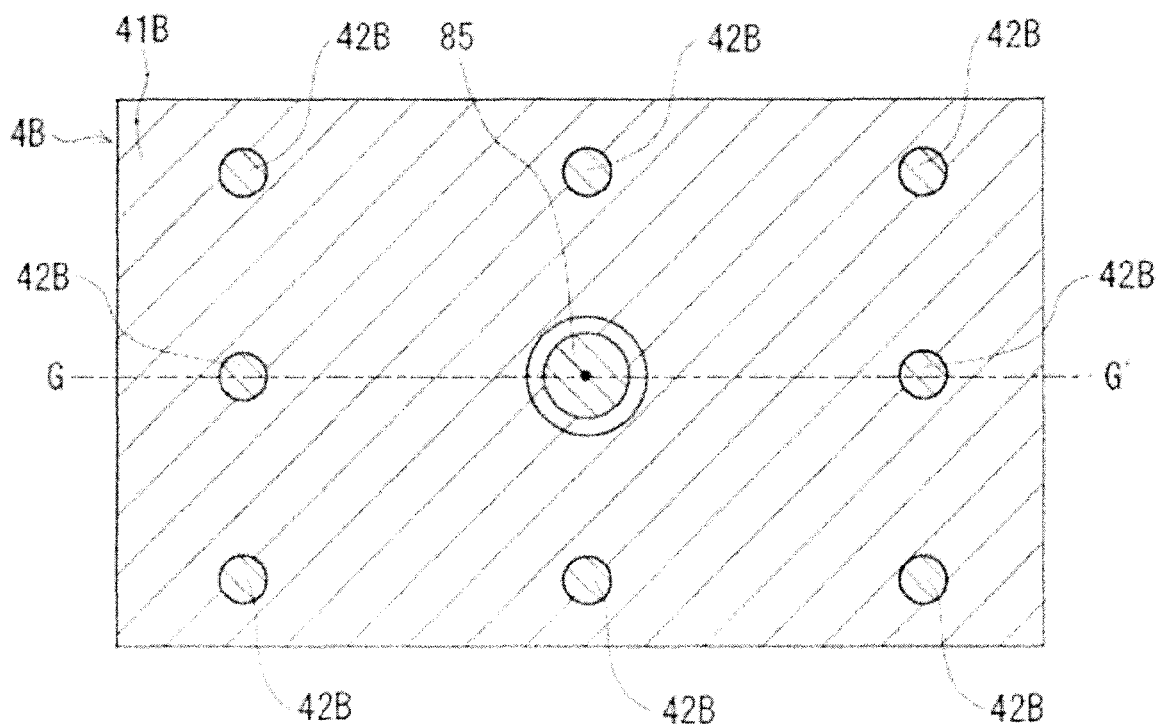
FIG. 10A is a plan view of vias and an antenna part.
Figure 10B:
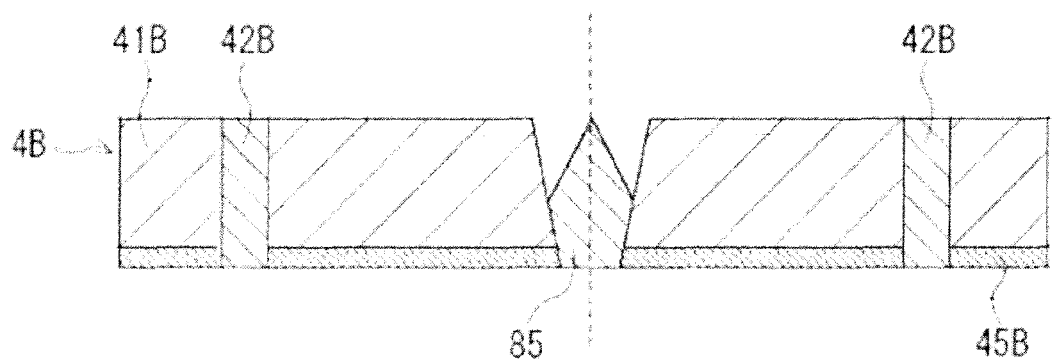
FIG. 10B is a cross-sectional view of the vias and the antenna part.

FIG. 10A is a plan view of the vias 42B and the antenna part 85. FIG. 10B is a cross-sectional view of the vias 42B of the antenna part 85 and illustrates a cross section taken along the line G-G' with alternating long and short dashes in FIG. 10A. The diameter of the antenna part 85 becomes smaller in a direction from a central part of the antenna part 85 toward one end thereof that is exposed on a front surface of the semiconductor substrate 41B and becomes smaller in a direction from the central part of the antenna part 85 toward the other end thereof that is exposed on a rear surface of the semiconductor substrate 41B. Accordingly, the antenna part 85 has a first inclined surface and a second inclined surface that are inclined with respect to a central line of a through-hole provided in the semiconductor substrate 41B. In FIG. 10B, the central line of the through-hole provided in the semiconductor substrate 41B is indicated by the dashed line. The first inclined surface of the antenna part 85 is a surface that is not in contact with the semiconductor substrate 41B and faces an obliquely upward direction. The second inclined surface of the antenna part 85 is a surface that is in contact with the semiconductor substrate 41B and faces an obliquely downward direction.

For example, as illustrated in FIG. 9, the antenna part 85 may be disposed between the antenna part 43 and the antenna part 44. As illustrated in FIG. 9, in the multilayer memory 1, the antenna part 43 and the antenna part 85 are disposed so that the inclined surface of the antenna part 43 and the first inclined surface of the antenna part 85 face each other. Since the inclined surface of the antenna part 43 and the first inclined surface of the antenna part 85 face each other, directivity gain becomes larger, and thus transmission in an oblique direction becomes possible. By disposing the pair of antenna parts 43 and 85 so that the inclined surface of the antenna part 43 and the first inclined surface of the antenna part 85 face each other, wireless communication in the oblique direction between the antenna part 43 and the antenna part 85 becomes possible. That is, wireless communication in the oblique direction may be performed between the memory chip 4A and the memory chip 4B that are in different layers of the multilayer memory 1.

As illustrated in FIG. 9, in the multilayer memory 1, the antenna part 44 and the antenna part 85 are disposed so that the inclined surface of the antenna part 44 and the second inclined surface of the antenna part 85 face each other. Since the inclined surface of the antenna part 44 and the second inclined surface of the antenna part 85 face each other, directivity gain becomes larger, and thus transmission in an oblique direction becomes possible. By disposing the pair of antenna parts 44 and 85 so that the inclined surface of the antenna part 44 and the second inclined surface of the antenna part 85 face each other, wireless communication in the oblique direction between the antenna part 44 and the antenna part 85 becomes possible. That is, wireless communication in the oblique direction may be performed between the memory chip 4B and the memory chip 4C that are in different layers of the multilayer memory 1.

The pair of antenna parts 43 and 85 may be disposed such that an angle of the inclined surface of the antenna part 43 with respect to the central line of the through-hole provided in the semiconductor substrate 41A is identical or approximate to that of the first inclined surface of the antenna part 85 with respect to the central line of the through-hole provided in the semiconductor substrate 41B. The pair of antenna parts 44 and 85 may be disposed such that an angle of the inclined surface of the antenna part 44 with respect to the central line of the through-hole provided in the semiconductor substrate 41C is identical or approximate to that of the second inclined surface of the antenna part 85 with respect to the central line of the through-hole provided in the semiconductor substrate 41B. A plurality of pairs of antenna parts 43 and 85 may be provided in the multilayer memory 1. A plurality of pairs of antenna parts 44 and 85 may be provided in the multilayer memory 1.

Figure 11A:
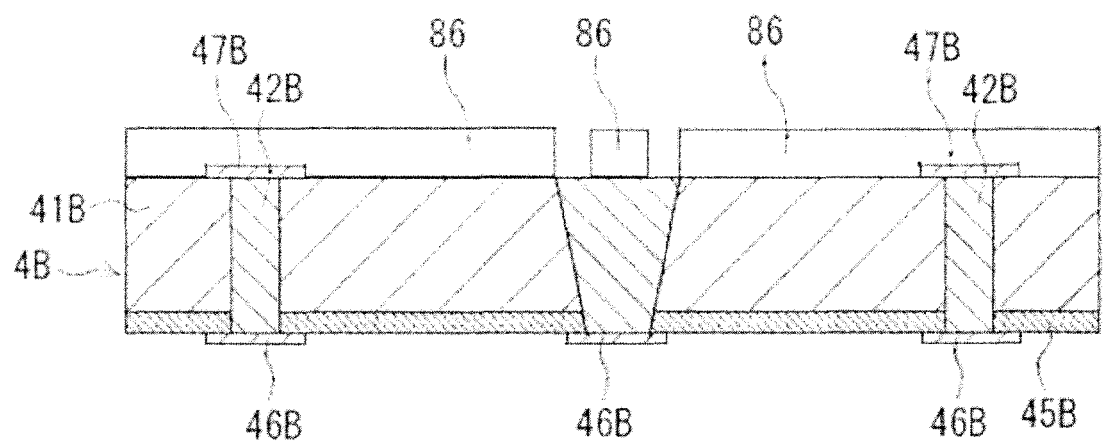
FIG. 11A is an explanatory view for explaining a method for forming the antenna part.
Figure 11B:
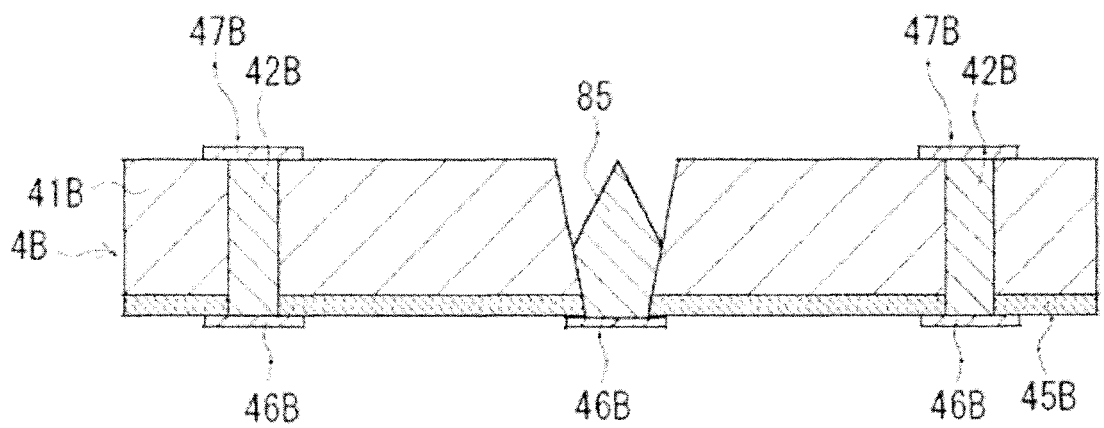
FIG. 11B is an explanatory view for explaining a method for forming the antenna part.

The following describes a method for forming the antenna part 85. First, through-holes each having a cylindrical shape and a through-hole having a tapered shape are formed in the semiconductor substrate 41B. The through-holes each having a cylindrical shape and the through-hole having a tapered shape that are provided in the semiconductor substrate 41B are filled with a metal such as copper or tungsten. Pads 46B that are to be connected to the vias 42B and the antenna part 85 are formed on the front surface of the semiconductor substrate 41B. Pads 47B that are to be connected to the vias 42B are formed on the rear surface of the semiconductor substrate 41B. The rear surface of the semiconductor substrate 41B is coated with resist liquid. Next, as illustrated in FIG. 11A, a resist pattern 86 is formed on the rear surface of the semiconductor substrate 41B by photolithography. Then, anisotropic etching is performed by using the resist pattern 86 as a mask. This forms the antenna part 85 in the through-hole having a tapered shape that is provided in the semiconductor substrate 41B as illustrated in FIG. 11B.

Embodiment 5

Figure 12:
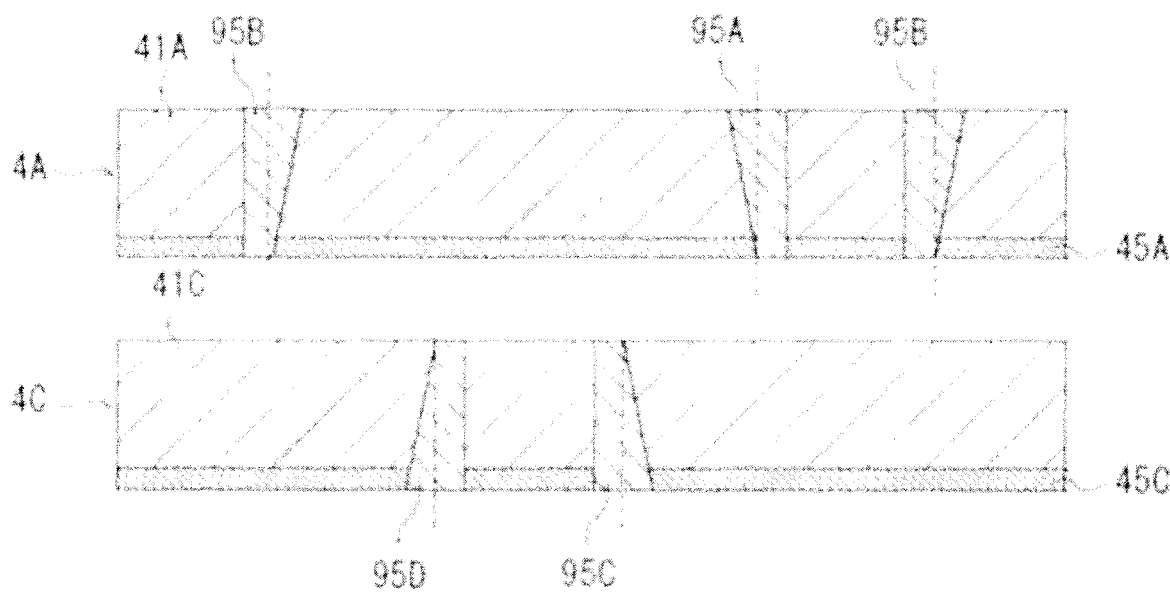
FIG. 12 is a cross-sectional view of antenna parts.

Embodiment 5 is described below. Identical constituent members to those in Embodiment 1 are given identical reference numerals and are not explained repeatedly. Embodiment 1 to Embodiment 5 may be combined. FIG. 12 is a cross-sectional view of antenna parts 95A to 95D. A memory chip 4A has a semiconductor substrate 41A and the antenna parts 95A and 95B provided in the semiconductor substrate 41A. The semiconductor substrate 41A has through-holes that penetrate the semiconductor substrate 41A. The antenna parts 95A and 95B are formed in the through-holes provided in the semiconductor substrate 41A. Accordingly, the antenna parts 95A and 95B penetrate the semiconductor substrate 41A. The antenna parts 95A and 95B transmit and receive a radio wave. A plurality of vias 42A is formed in the semiconductor substrate 41A although the plurality of vias 42A are not illustrated in FIG. 12.

A memory chip 4C has a semiconductor substrate 41C and antenna parts 95C and 95D provided in the semiconductor substrate 41C. The semiconductor substrate 41C has through-holes that penetrate the semiconductor substrate 41C. The antenna parts 95C and 95D are formed in the through-holes provided in the semiconductor substrate 41C. Accordingly, the antenna parts 95C and 95D penetrate the semiconductor substrate 41C. The antenna parts 95C and 95D transmit and receive a radio wave. A plurality of vias 42B is formed in the semiconductor substrate 41C although the plurality of vias 42B are not illustrated in FIG. 12.

The diameter of each of the antenna parts 95A and 95B becomes larger in a direction from one end thereof that is exposed on a front surface of the semiconductor substrate 41A toward the other end thereof that is exposed on a rear surface of the semiconductor substrate 41A. The antenna part 95A has a parallel surface that is parallel with a central line of the through-hole provided in the semiconductor substrate 41A and an inclined surface that is inclined with respect to the central line of the through-hole provided in the semiconductor substrate 41A. The parallel surface of the antenna part 95A is a surface that is in contact with the semiconductor substrate 41A and faces a planar direction of the semiconductor substrate 41A. The inclined surface of the antenna part 95A is a surface that is in contact with the semiconductor substrate 41A and faces an obliquely downward direction. The antenna part 95B has a parallel surface that is parallel with a central line of the through-hole provided in the semiconductor substrate 41A and an inclined surface that is inclined with respect to the central line of the through-hole provided in the semiconductor substrate 41A. The parallel surface of the antenna part 95B is a surface that is in contact with the semiconductor substrate 41A and faces the planar direction of the semiconductor substrate 41A. The inclined surface of the antenna part 95B is a surface that is in contact with the semiconductor substrate 41A and faces an obliquely downward direction. In FIG. 12, the central lines of the through-holes provided in the semiconductor substrate 41A are indicated by the dashed lines.

The diameter of each of the antenna parts 95C and 95D becomes smaller in a direction from one end thereof that is exposed on a front surface of the semiconductor substrate 41C toward the other end thereof that is exposed on a rear surface of the semiconductor substrate 41C. The antenna part 95C has a parallel surface that is parallel with a central line of the through-hole provided in the semiconductor substrate 41C and an inclined surface that is inclined with respect to the central line of the through-hole provided in the semiconductor substrate 41C. The parallel surface of the antenna part 95C is a surface that is in contact with the semiconductor substrate 41C and faces a planar direction of the semiconductor substrate 41C. The inclined surface of the antenna part 95C is a surface that is in contact with the semiconductor substrate 41C and faces an obliquely upward direction. The antenna part 95D has a parallel surface that is parallel with a central line of the through-hole provided in the semiconductor substrate 41C and an inclined surface that is inclined with respect to the central line of the through-hole provided in the semiconductor substrate 41C. The parallel surface of the antenna part 95D is a surface that is in contact with the semiconductor substrate 41C and faces the planar direction of the semiconductor substrate 41C. The inclined surface of the antenna part 95D is a surface that is in contact with the semiconductor substrate 41C and faces an obliquely upward direction. In FIG. 12, the central lines of the through-holes provided in the semiconductor substrate 41C are indicated by the dashed lines.

As illustrated in FIG. 12, in the multilayer memory 1, the antenna part 95A and the antenna part 95C are disposed so that the inclined surface of the antenna part 95A and the inclined surface of the antenna part 95C face each other. Since the inclined surface of the antenna part 95A and the inclined surface of the antenna part 95C face each other, directivity gain becomes larger, and thus transmission in an oblique direction becomes possible. By disposing the pair of antenna parts 95A and 95C so that the inclined surface of the antenna part 95A and the inclined surface of the antenna part 95C face each other, wireless communication in the oblique direction in the multilayer memory 1 becomes possible via the antenna parts 95A and 95C. That is, wireless communication in the oblique direction may be performed between the memory chip 4A and the memory chip 4C that are in different layers of the multilayer memory 1.

As illustrated in FIG. 12, in the multilayer memory 1, the antenna part 95B and the antenna part 95D are disposed so that the inclined surface of the antenna part 95B and the inclined surface of the antenna part 95D face each other. Since the inclined surface of the antenna part 95B and the inclined surface of the antenna part 95D face each other, directivity gain becomes larger, and thus transmission in an oblique direction becomes possible. By disposing the pair of antenna parts 95B and 95D so that the inclined surface of the antenna part 95B and the inclined surface of the antenna part 95D face each other, wireless communication in the oblique direction in the multilayer memory 1 becomes possible via the antenna parts 95B and 95D. That is, wireless communication in the oblique direction may be performed between the memory chip 4A and the memory chip 4C that are in different layers of the multilayer memory 1.

The pair of antenna parts 95A and 95C may be disposed such that an angle of the inclined surface of the antenna part 95A with respect to the central line of the through-hole provided in the semiconductor substrate 41A is identical or approximate to that of the inclined surface of the antenna part 95C with respect to the central line of the through-hole provided in the semiconductor substrate 41C. The pair of antenna parts 95B and 95D may be disposed such that an angle of the inclined surface of the antenna part 95B with respect to the central line of the through-hole provided in the semiconductor substrate 41A is identical or approximate to that of the inclined surface of the antenna part 95D with respect to the central line of the through-hole provided in the semiconductor substrate 41C.

Figure 13:
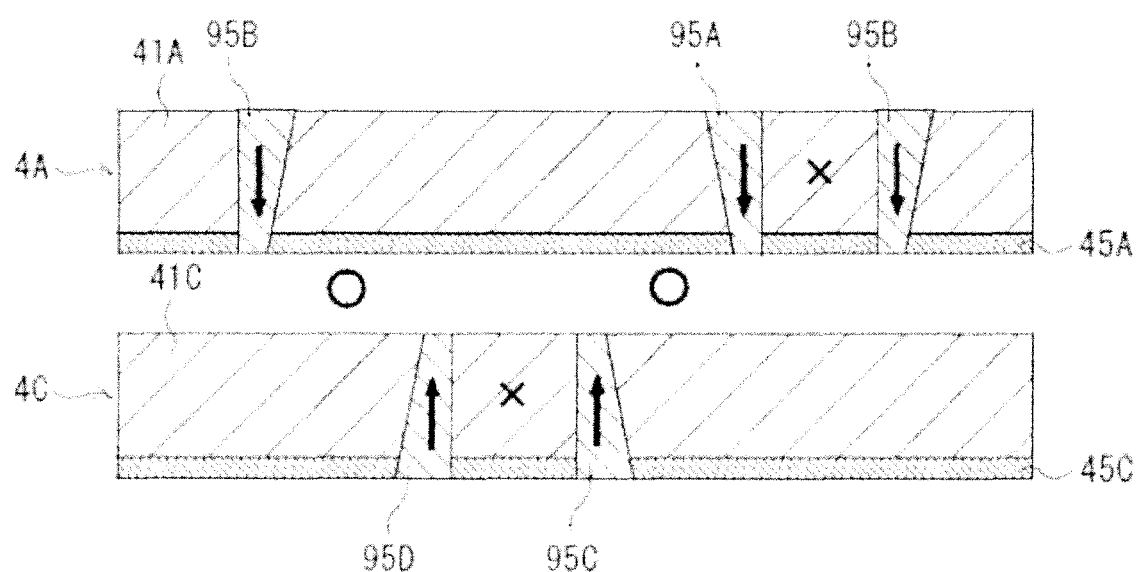
FIG. 13 illustrates magnetic field coupling of the antenna parts.

FIG. 13 illustrates magnetic field coupling of the antenna parts 95A to 95D. The arrows in FIG. 13 indicate directions of electric currents flowing through the antenna parts 95A to 95D. The circles in FIG. 13 indicate that magnetic fields are enhancing each other. The cross marks in FIG. 13 indicate that magnetic fields are canceling out each other. By controlling the directions of the electric currents flowing through the antenna parts 95A to 95D, it is possible to strengthen directivity of the antenna parts 95A to 95D.

The direction of the electric current flowing through the antenna part 95A is opposite to that of the electric current flowing through the antenna part 95C. This causes magnetic fields to enhance each other between the antenna part 95A and the antenna part 95C. Since the direction of the electric current flowing through the antenna part 95A is opposite to that of the electric current flowing through the antenna part 95C, it is possible to increase a communication distance between the antenna part 95A and the antenna part 95C. The direction of the electric current flowing through the antenna part 95B is opposite to that of the electric current flowing through the antenna part 95D. This causes magnetic fields to enhance each other between the antenna part 95B and the antenna part 95D. Since the direction of the electric current flowing through the antenna part 95B is opposite to that of the electric current flowing through the antenna part 95D, it is possible to increase a communication distance between the antenna part 95B and the antenna part 95D.

The antenna parts 95A and 95B are disposed so as to be adjacent to each other in an identical layer of the multilayer memory 1. The antenna part 95A and the antenna part 95B are disposed so that the parallel surface of the antenna part 95A and the parallel surface of the antenna part 95B face each other. The direction of the electric current flowing through the antenna part 95A is identical to that of the electric current flowing through the antenna part 95B. This causes magnetic fields to cancel out each other between the antenna part 95A and the antenna part 95B. Accordingly, wireless communication may not be performed between the antenna part 95A and the antenna part 95B. Since the direction of the electric current flowing through the antenna part 95A is identical to that of the electric current flowing through the antenna part 95B, it is possible to inhibit wireless communication between the antenna part 95A and the antenna part 95B that are disposed so as to be adjacent to each other in an identical layer of the multilayer memory 1.

The antenna parts 95C and 95D are disposed so as to be adjacent to each other in an identical layer of the multilayer memory 1. The antenna part 95C and the antenna part 95D are disposed so that the parallel surface of the antenna part 95C and the parallel surface of the antenna part 95D face each other. The direction of the electric current flowing through the antenna part 95C is identical to that of the electric current flowing through the antenna part 95D. This causes magnetic fields to cancel out each other between the antenna part 95C and the antenna part 95D. Accordingly, wireless communication may not be performed between the antenna part 95C and the antenna part 95D. Since the direction of the electric current flowing through the antenna part 95C is identical to that of the electric current flowing through the antenna part 95D, it is possible to inhibit wireless communication between the antenna part 95C and the antenna part 95D that are disposed so as to be adjacent to each other in an identical layer of the multilayer memory 1.

Embodiment 6

Figure 14:
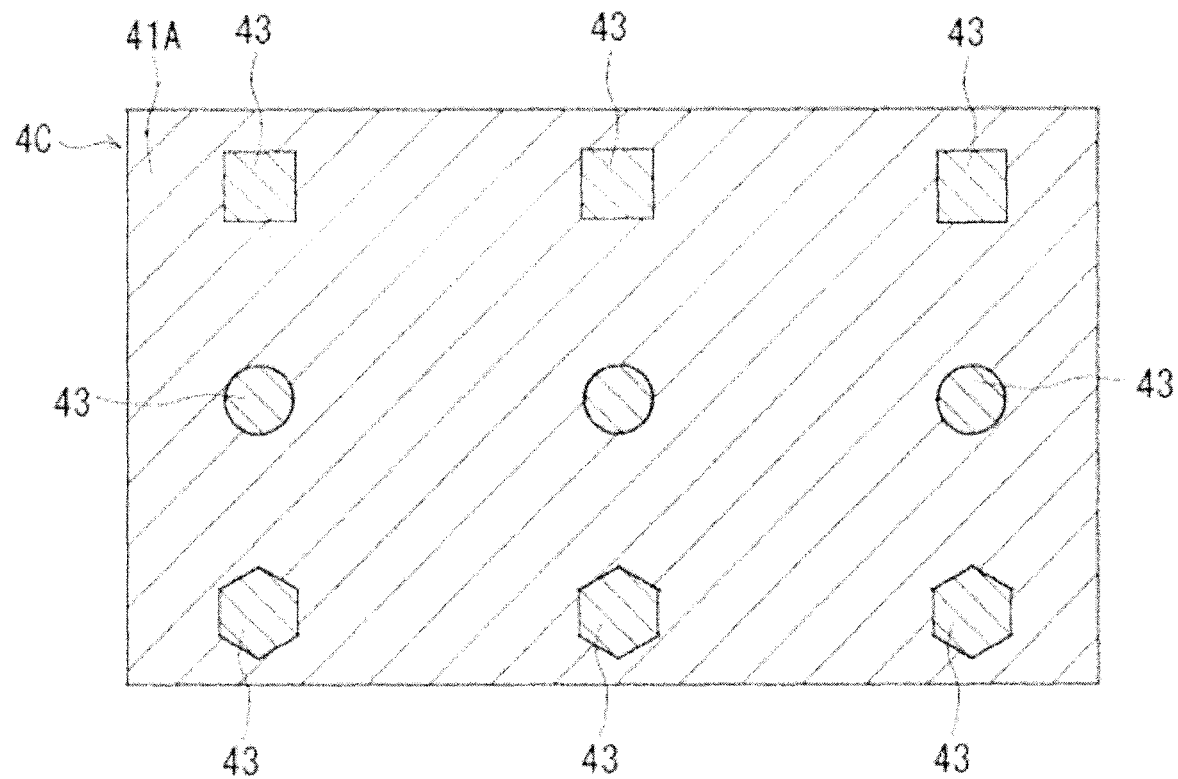
FIG. 14 is a plan view of an antenna part.

Embodiment 6 is described below. Identical constituent members to those in Embodiment 1 are given identical reference numerals and are not explained repeatedly. Embodiment 1 has described an example in which the outline of the antenna part 43 has a circular shape in plan view as illustrated in FIG. 3A. The outline of the antenna part 43 may have a circular shape in plan view or may have a polygonal shape such as a quadrangular shape or a hexagonal shape in plan view as illustrated in FIG. 14. Furthermore, the outline of the antenna part 44 may have a circular shape in plan view or may have a polygonal shape such as a quadrangular shape or a hexagonal shape in plan view. In Embodiment 2 through Embodiment 5, the outline of each of the antenna parts 63, 64, 73, 74, 85, and 95A to 95D may have a circular shape in plan view or may have a polygonal shape such as a quadrangular shape or a hexagonal shape in plan view.

According to Embodiment 1 through Embodiment 6, wireless communication in an oblique direction may be performed in the multilayer memory 1 when a CPU 2 accesses memory blocks of the memory chips 4A to 4C. According to Embodiment 1 through Embodiment 6, a communication distance in such wireless communication is shorter than that in wireless communication in the vertical direction and the horizontal direction. This reduces latency, thereby improving performance of the multilayer memory 1.

In a case where a defect occurs in a multilayer memory, such a defective multilayer memory is replaced with new one. A defect in a multilayer memory occurs because a defective block (defective region) in which data is not stored occurs in a memory block (storage region) of the multilayer memory.

Since a multilayer memory is soldered onto a substrate, the multilayer memory is removed from the substrate by a method such as solder reflow in the case of occurrence of a defect in the multilayer memory. Therefore, replacement of a multilayer memory in the case of occurrence of a defect in the multilayer memory is not easy as compared with a dual inline memory module (DIMM) type memory. Since replacement of a multilayer memory is not easy, an improvement in reliability of the multilayer memory through redundancy of a memory block is desired. For example, redundancy of a memory block is achieved by replacing a defective block with a redundant block.

According to Embodiment 1 through Embodiment 6, the wireless communication in the oblique direction in the multilayer memory 1 allows the CPU 2 to access a redundant block. According to Embodiment 1 through Embodiment 6, a communication distance is shorter as compared with a case where the CPU 2 accesses the redundant block through wireless communication in the vertical direction or the horizontal direction. It is therefore possible to shorten a period of time which it takes for the CPU 2 to access the redundant block.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor chip having
   a first antenna that is formed in a first hole provided in the first semiconductor chip, has an inclined surface inclined with respect to a central line of the first hole, and transmits and receives a radio wave; and
   a second semiconductor chip stacked over the first semiconductor chip, the second semiconductor chip having
   a second antenna that is formed in a second hole provided in the second semiconductor chip, has an inclined surface inclined with respect to a central line of the second hole, and transmits and receives a radio wave, wherein
   the first antenna and the second antenna are disposed so that the inclined surface of the first antenna and the inclined surface of the second antenna face each other.

2. The semiconductor device according to claim 1, further comprising:
   a third semiconductor chip that is disposed between the first semiconductor chip and the second semiconductor chip, the third semiconductor chip having
   a third antenna that is formed in a third hole provided in the third semiconductor chip, has a first inclined surface and a second inclined surface inclined with respect to a central line of the third hole, and transmits and receives a radio wave, wherein
   the first antenna, the second antenna, and the third antenna are disposed so that the inclined surface of the first antenna and the first inclined surface of the third antenna face each other and so that the inclined surface of the second antenna and the second inclined surface of the third antenna face each other.

3. The semiconductor device according to claim 1, wherein
   the first semiconductor chip has a fourth antenna that is formed in a fourth hole provided in the first semiconductor chip, that has a parallel surface parallel with a central line of the fourth hole and an inclined surface inclined with respect to the central line of the fourth hole, and that transmits and receives a radio wave,
   the first antenna has a parallel surface parallel with the central line of the first hole and an inclined surface inclined with respect to the central line of the first hole,
   the first antenna and the fourth antenna are disposed so that the parallel surface of the first antenna and the parallel surface of the fourth antenna face each other, and
   a direction of an electric current flowing through the first antenna is identical to a direction of an electric current flowing through the fourth antenna.

* * * * *